(12) United States Patent
Yamamoto et al.

(10) Patent No.: US 10,968,581 B2
(45) Date of Patent: *Apr. 6, 2021

(54) MAGNETIC MARKER AND MAGNETIC MARKER DETECTION SYSTEM

(71) Applicant: AICHI STEEL CORPORATION, Tokai (JP)

(72) Inventors: Michiharu Yamamoto, Tokai (JP); Tomohiko Nagao, Tokai (JP); Hitoshi Aoyama, Tokai (JP)

(73) Assignee: AICHI STEEL CORPORATION, Tokai (JP)

(*) Notice: Subject to any disclaimer, the term of this patent is extended or adjusted under 35 U.S.C. 154(b) by 143 days.

This patent is subject to a terminal disclaimer.

(21) Appl. No.: 15/763,236

(22) PCT Filed: Oct. 17, 2016

(86) PCT No.: PCT/JP2016/080724
§ 371 (c)(1),
(2) Date: Mar. 26, 2018

(87) PCT Pub. No.: WO2017/069089
PCT Pub. Date: Apr. 27, 2017

(65) Prior Publication Data
US 2018/0305875 A1    Oct. 25, 2018

(30) Foreign Application Priority Data

Oct. 19, 2015 (JP) .............................. JP2015-205775

(51) Int. Cl.
*E01F 9/30* (2016.01)
*G08G 1/042* (2006.01)
(Continued)

(52) U.S. Cl.
CPC .............. *E01F 9/30* (2016.02); *G01R 33/063* (2013.01); *G01R 33/098* (2013.01); *G05D 1/02* (2013.01);
(Continued)

(58) Field of Classification Search
CPC ................. G01D 5/2006; G01D 5/145; G01D 2201/0213; G05D 1/0259; G05D 1/0261;
(Continued)

(56) References Cited

U.S. PATENT DOCUMENTS 5,853,846 A * 12/1998 Clark ........................ B32B 5/16
428/131
5,913,376 A * 6/1999 Takei ................... G05D 1/0261
180/168

(Continued)

FOREIGN PATENT DOCUMENTS

JP         51-26590        8/1976
JP         10-280344 A    10/1998
(Continued)

OTHER PUBLICATIONS

Extended European Search Report dated Jun. 4, 2019 in Patent Application No. 16857404.4, 7 pages.

*Primary Examiner* — Huy Q Phan
*Assistant Examiner* — Dustin R Dickinson
(74) *Attorney, Agent, or Firm* — Oblon, McClelland, Maier & Neustadt, L.L.P.

(57) ABSTRACT

Provided are a magnetic marker and a magnetic marker detection system with a reduced magnetic force. The magnetic marker detection system (1S) in which magnetism generated from the magnetic marker (1) laid on a road surface (53) is detected by a magnetic sensor (2) attached to a vehicle's body floor (50) of a vehicle (5) is a system with the magnetic marker (1) and the magnetic sensor (2) in
(Continued)

combination, the magnetic marker having a surface with a magnetic flux density equal to or smaller than 40 mT and the magnetic sensor using a magneto-impedance element including an amorphous wire as a magneto-sensitive body with impedance in a high-frequency region changing in accordance with an external magnetic field.

13 Claims, 6 Drawing Sheets

(51) Int. Cl.
*H01F 7/02* (2006.01)
*G05D 1/02* (2020.01)
*G08B 21/00* (2006.01)
*H01F 1/113* (2006.01)
*G08G 1/0962* (2006.01)
*G08G 1/16* (2006.01)
*G01R 33/06* (2006.01)
*G01R 33/09* (2006.01)
*B62D 15/02* (2006.01)

(52) U.S. Cl.
CPC .......... *G05D 1/0259* (2013.01); *G08B 21/00* (2013.01); *G08G 1/042* (2013.01); *G08G 1/09623* (2013.01); *G08G 1/167* (2013.01); *H01F 1/113* (2013.01); *H01F 7/02* (2013.01); *B62D 15/025* (2013.01); *B62D 15/029* (2013.01); *G05D 2201/0213* (2013.01)

(58) Field of Classification Search
CPC .. G05D 1/0263; B62D 15/025; B62D 15/029; E01F 9/30
See application file for complete search history.

(56) References Cited

U.S. PATENT DOCUMENTS

| | | | | |
|---|---|---|---|---|
| 6,215,392 | B1* | 4/2001 | Okada | B62D 1/28 340/436 |
| 6,292,109 | B1* | 9/2001 | Murano | G08G 1/164 340/902 |
| 6,336,064 | B1* | 1/2002 | Honkura | G01C 21/26 701/23 |
| 6,468,678 | B1 | 10/2002 | Dahlin et al. | |
| 2012/0303304 | A1* | 11/2012 | Kim | G01V 15/00 702/65 |
| 2013/0154855 | A1* | 6/2013 | Yoo | G08G 1/042 340/935 |
| 2016/0132705 | A1* | 5/2016 | Kovarik | G06K 7/10376 340/10.3 |

FOREIGN PATENT DOCUMENTS

| | | |
|---|---|---|
| JP | 2000-90387 A | 3/2000 |
| JP | 2001-125638 A | 5/2001 |
| JP | 2002-169614 A | 6/2002 |
| JP | 2003-27432 A | 1/2003 |
| JP | 2005-202478 A | 7/2005 |
| JP | 3834926 B2 | 10/2006 |
| JP | 2008-47148 A | 2/2008 |
| WO | WO 96/16231 A1 | 5/1996 |
| WO | WO 99/17079 A1 | 4/1999 |

* cited by examiner

[FIG. 1]
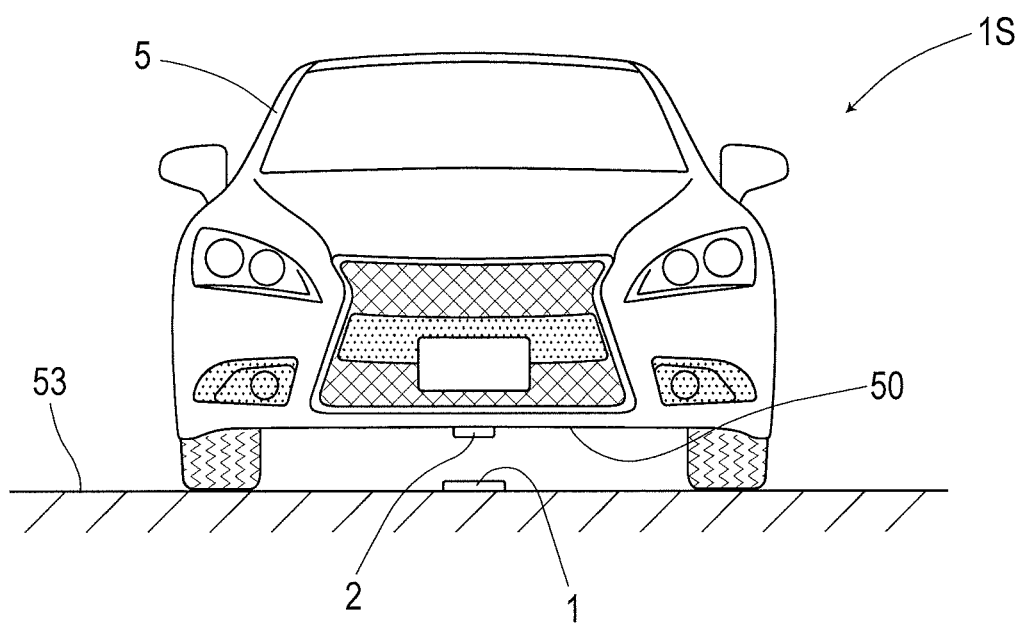

[FIG. 2]
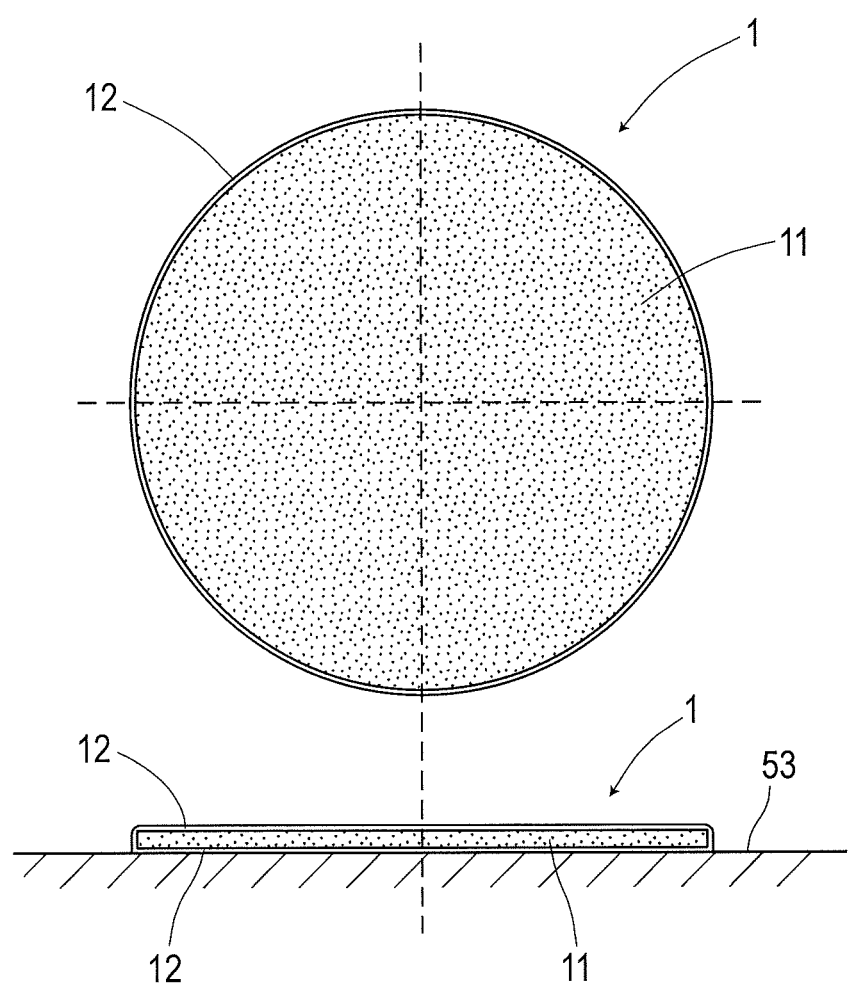

[FIG. 3]
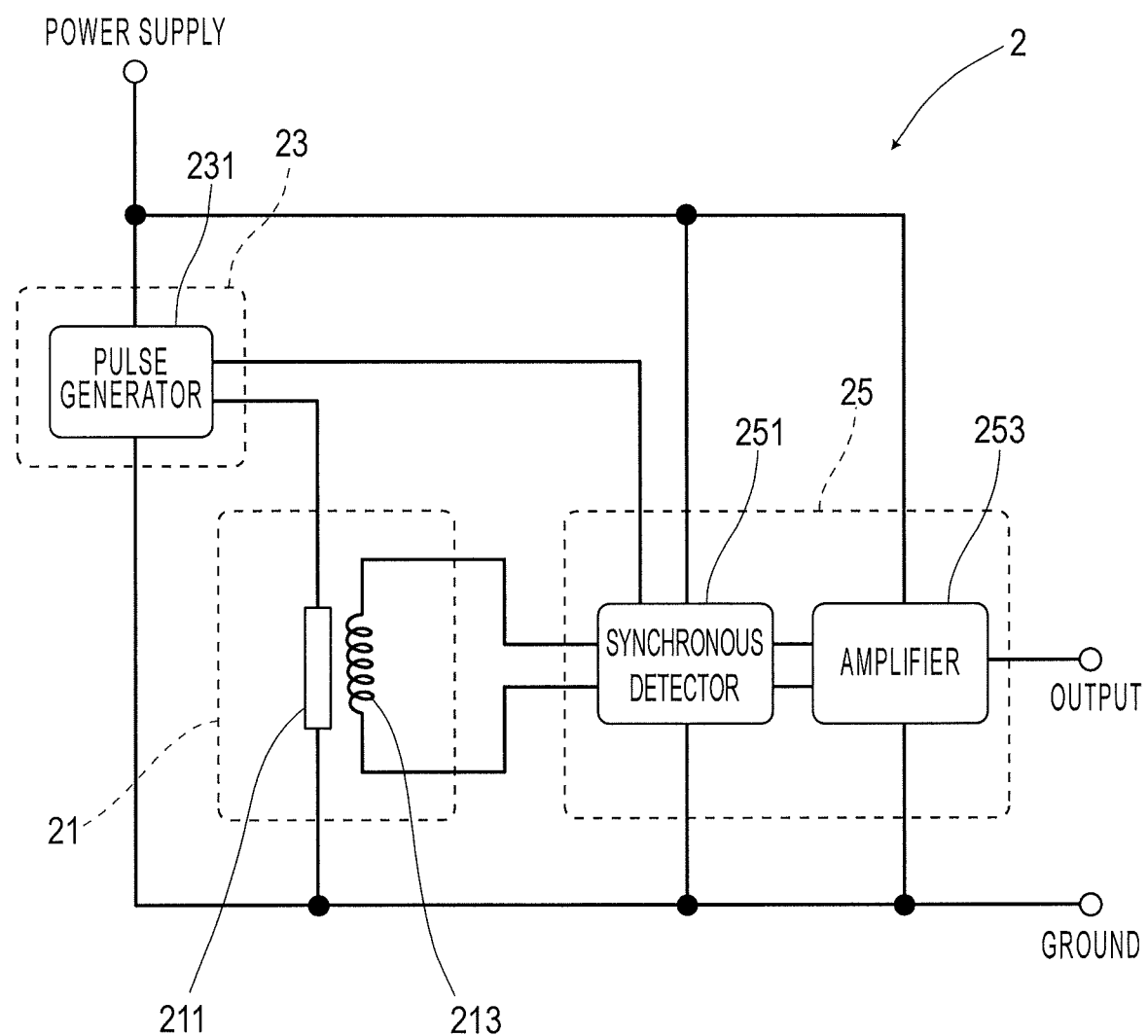

[FIG. 4]
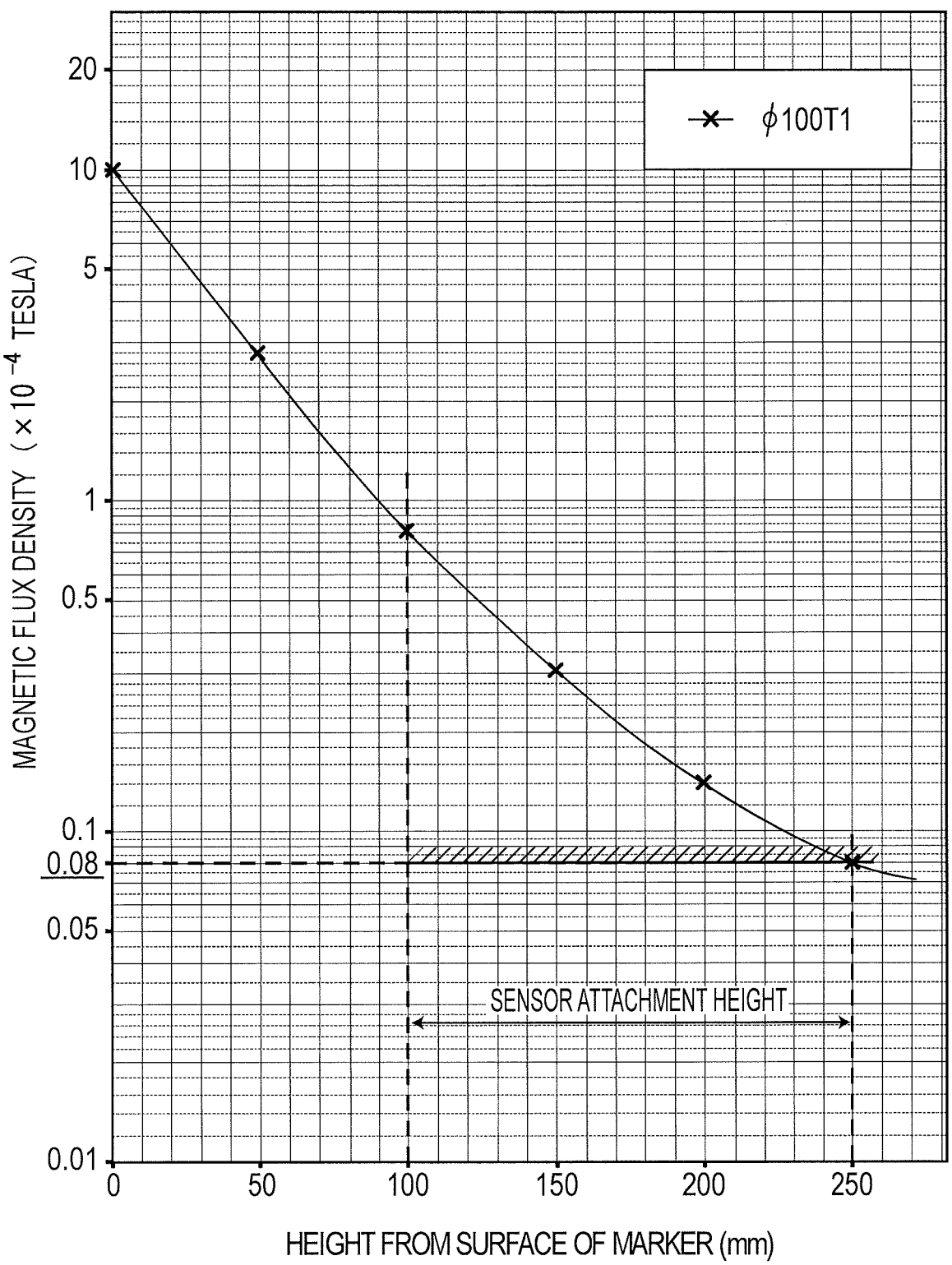

[FIG. 5]
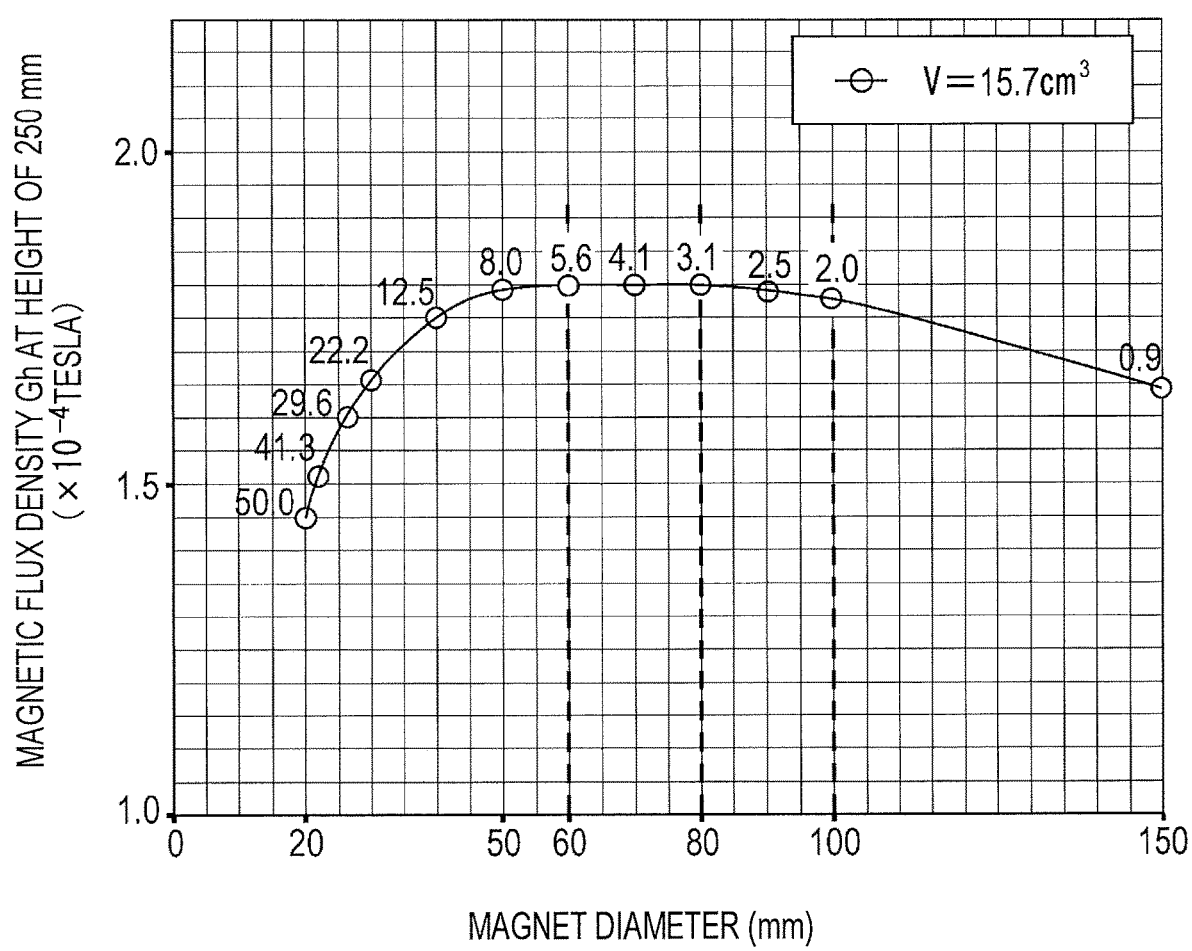

[FIG. 6]
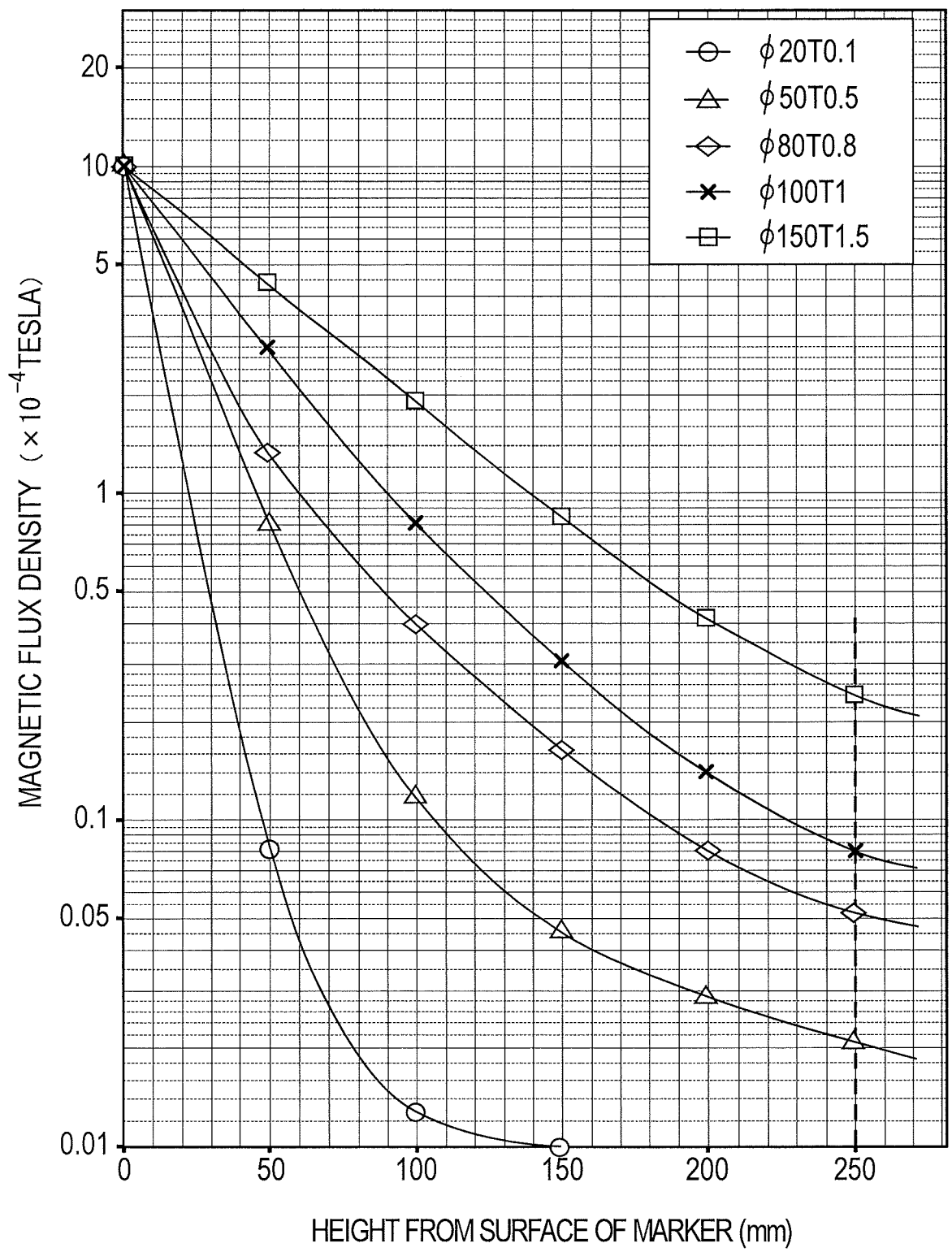

MAGNETIC MARKER AND MAGNETIC MARKER DETECTION SYSTEM

TECHNICAL FIELD OF THE INVENTION

The present invention relates to magnetic markers laid on a road.

BACKGROUND OF THE INVENTION

Conventionally, a magnetic marker detection system for vehicles using a magnetic marker laid on a road has been known (for example, refer to Japanese Unexamined Patent Application Publication No. 2005-202478). This magnetic marker detection system is to provide various driving supports using the magnetic marker laid along a lane, such as automatic steering control and lane departure warning, for vehicles equipped with magnetic sensors.

PATENT LITERATURE

Patent Literature 1: JP 2005-202478

SUMMARY OF THE INVENTION

However, the above-described conventional magnetic marker detection system for vehicles has the following problem. That is, while the magnetic marker has to have a strong magnetic force to some extent so as to be detectable by the magnetic sensor on the vehicle attached at a high position on the order of 100 mm to 250 mm from a road surface, if the magnetic force of the magnetic marker is too strong, a metallic substance such as a nail or bolt falling on the road surface may be attracted to the magnetic marker to induce troubles such as a flat tire of a vehicle.

The present invention was made in view of the above-described conventional problem to provide a magnetic marker and magnetic marker detection system with a reduced magnetic force.

A first aspect of the present invention is directed to a magnetic marker laid on a road surface so as to be detectable by a magnetic sensor attached to a bottom surface side of a vehicle to achieve driving support control on a vehicle side for supporting driving of a driver, wherein the magnetic marker has a surface with a magnetic flux density Gs equal to or smaller than 40 mT (milli-tesla, 400 G).

A second aspect of the present invention is directed to a magnetic marker detection system in which magnetism generated from a magnetic marker laid on a road surface is detected by a magnetic sensor attached to a bottom surface side of a vehicle to achieve driving support control on a vehicle side, wherein the magnetic marker is the magnetic marker according to the first aspect.

In the magnetic marker according to the present invention, the magnetic flux density Gs of the surface equal to or smaller than 40 mT is equivalent to or smaller than that of, for example, a magnetic sheet for office use to be attached to a whiteboard at an office. The magnetic flux density to this extent does not correspond to a magnetic force of magnetically pulling and attracting a metallic substance such as a nail or bolt falling on the road. Therefore, even if the magnetic marker according to the present invention is laid on the road surface, a fear of magnetically attracting a metallic substance such as a nail or bolt is small, and a fear of inducing a trouble such as a flat tire of a vehicle is small.

As described above, in the magnetic marker according to the present invention, the magnetic force is reduced, and a fear of attracting a metallic substance is decreased. In the magnetic marker detection system according to the present invention, a magnetic marker with a reduced magnetic force is adopted, thereby decreasing the fear of the magnetic marker attracting a metallic substance.

BRIEF DESCRIPTIONS OF THE DRAWINGS

FIG. 1 is a diagram for describing a magnetic marker detection system in one embodiment;

FIG. 2 depicts a top view and a side view of a magnetic marker in the embodiment;

FIG. 3 is a block diagram depicting an electric structure of a magnetic sensor in the embodiment;

FIG. 4 is a graph depicting a magnetic field distribution of the magnetic marker in a vertical direction in the embodiment;

FIG. 5 is a graph exemplarily depicting a relation between the diameter of a magnet and a magnetic flux density Gh at a position at a height of 250 mm in the embodiment; and FIG. 6 is a graph depicting a magnetic field distribution of the magnetic marker in the vertical direction in the embodiment.

DESCRIPTIONS OF THE PREFERRED EMBODIMENTS

As a magnetic marker according to the present invention, a plastic magnet or rubber magnet is suitably adopted. For example, if the plastic magnet or rubber magnet resistant to cracking compared with a sintered magnet or the like is adopted, a magnetic marker resistant to use for a long period of time can be provided. Also, if the magnet of this type moldable at relatively low cost with high accuracy is adopted, a high-quality magnetic marker can be provided at reduced production cost. Furthermore, for example, a flexible rubber magnet can also flexibly address asperities on a road surface at the time of construction, deformation of asperities on a road surface in operation, and so forth.

Various driving support control can be achieved on a vehicle side by laying the magnetic marker according to the present invention, including travel control, warning control, and information notification control or the like. The travel control includes, for example, automatic steering control for causing a vehicle to travel along magnetic markers laid along a lane, merge/branch control using magnetic markers laid on a merge road/branch road, and stop control for stopping the vehicle when magnetic marker laid before a stop line at an intersection or the like is detected. The warning control includes, for example, control of warning the driver of a lane departure with reference to magnetic markers laid along a lane and control of warning the driver of an excessive speed when the vehicle passes through magnetic markers laid before an intersection or the like. The information notification control includes control for notifying that the vehicle is approaching an intersection, a branch road, or a tollgate, and control for accurately notifying that the vehicle is approaching a position of an intersection where the vehicle is to turn right during navigation for route guide. The notification control may further include control for notifying information acquirable on the vehicle side by reading the arrangement of the N pole and the S pole of the magnetic markers.

A magnetic marker of a suitable aspect of the present invention has a surface with a magnetic flux density Gs equal to or smaller than 5 mT, which corresponds to a magnetic force significantly weaker than that of, for example, a magnetic sheet for office use with a surface magnetic flux density on the order of 40 mT. With the magnetic flux density Gs of the surface reduced to be equal to or smaller than 5 mT, a fear of attracting a metallic substance on a road surface can be further decreased. On the other hand, when the magnetic flux density Gs of the surface exceeds 40 mT, a magnetic force stronger than the magnetic force of, for example, a magnetic sheet for office use, occurs, and thus the possibility of attracting a metallic substance on a road surface increases. The magnetic flux density Gs of the surface may be a magnetic flux density of magnetism in, for example, a vertical direction or any other direction.

A magnetic marker of a suitable aspect of the present invention has a magnetic flux density Gh at a position at a height of 250 mm with reference to the surface of the magnetic marker being equal to or larger than 0.5 µT.

In consideration of the above-ground height of the vehicle's body floor of any of various vehicles including passenger vehicles, buses, and trucks or the like, it is required to assume an attachment height of the magnetic sensor in a range up to 250 mm. Any magnetic marker acting with magnetism having the magnetic flux density Gh equal to or larger than 0.5 µT at a position at a height of 250 mm can be reliably detected by using a highly-sensitive sensor, such as a MI sensor using a magneto-impedance element with a magnetic flux resolution on the order of, for example, 0.01 µT to 0.02 µT, a fluxgate sensor, or a TMR sensor. The magnetic flux density Gh may be a magnetic flux density of magnetism in a vertical direction or any other direction.

A magnetic marker of a suitable aspect of the present invention has a diameter equal to or larger than 80 mm. In general, a magnet having a larger diameter tends to have a higher magnetism reach ratio, which is a ratio of a magnetic flux density reaching at a distant position with respect to the magnetic flux density Gs of the surface. For example, it can be expected that a magnet having a large diameter equal to or larger than 80 mm has a high magnetism reach ratio, allowing the magnetic flux density Gs of the surface to be relatively reduced while the magnetic flux density Gh at the position at the height of 250 mm is kept high. In this manner, a magnetic marker having a diameter equal to or larger than 80 mm can reduce the magnetic flux density Gs of the surface while keeping a high magnetic flux density of magnetism acting on the magnetic sensor. Although the diameter may be equal to or smaller than 80 mm, the magnetic flux density Gh at the height of 250 mm is decreased in this case, and thus the sensitivity of the magnetic sensor may have to be increased.

A magnetic marker of a suitable aspect of the present invention has a surface to which a coating or resin mold having a waterproof and wear-resistant effect is applied. Applying a coating or resin mold to the surface can improve durability of the magnetic marker. The coating or resin mold may be applied also to a surface of the magnetic marker to be laid down, such as a back surface or outer peripheral side surface.

A magnetic marker of a suitable aspect of the present invention has a flat shape having a thickness equal to or smaller than 5 mm and can be laid on the road surface without boring a recessed accommodation hole. Any magnetic marker that can be laid without boring a recessed accommodation hole or the like in the road surface can be laid by highly-efficient laying work at low cost. Methods for fixing to the road surface include, for example, adhesive joint with a material having an adhesive function or the like and fixing by hammering a pin or the like into the road surface.

In a magnetic marker detection system of one suitable aspect of the present invention, at least one type among a magneto-impedance sensor (MI sensor), a fluxgate sensor, and a TMR sensor is used as the magnetic sensor. The magneto-impedance sensor, the fluxgate sensor, and the TMR sensor are all known as magnetic sensors that can detect magnetism with high sensitivity. A magnetic marker detection system using at least one type among these can reliably detect magnetism generated from the magnetic marker with the reduced magnetic flux density Gs of the surface combined for use.

The magneto-impedance (MI) sensor is a magnetic sensor using a magneto-impedance element including a magneto-sensitive body with its impedance changing in accordance with an external magnetic field.

The magneto-impedance element (MI element) is an element which detects magnetism by using the magneto-impedance effect (MI effect), in which the depth (thickness) of the skin layer is fluctuated by the external magnetic field due to the skin effect, in which the current density of skin layer increases when a pulse current, high-frequency current, or the like flows through the magneto-sensitive body, causing the impedance of the magneto-sensitive body to change in a sensitive manner. According to the MI element using this MI effect, highly-sensitive magnetic measurements can be performed. The use of the MI element can achieve a low-cost, small-sized magnetic sensor capable of detecting feeble magnetism on the order of, for example, 0.5 µT to 10 µT. Note that as for the MI sensor using the MI element, many applications have been filed and detailed descriptions are in, for example, International Publication No. WO2005/19851, International Publication No. WO2009/119081, and Japanese Patent No. 4655247.

The magneto-sensitive body of the MI element is preferably a high-permeability alloy magnetic body. For example, a magnetic body such as a wire, a thin film, or the like made of a soft magnetic material such as a CoFeSiB-based alloy is preferable. In particular, a zero-magnetostriction amorphous wire is preferable in view of sensitivity, cost, and so forth.

For example, a change in impedance of the magneto-sensitive body when a high-frequency current or the like flows may be directly detected from the voltage between the ends of the magneto-sensitive body or may be indirectly detected via a detection coil (pickup coil) wound around the magneto-sensitive body as a change in electromotive force. If the MI element includes a detection coil, detection in a direction of magnetism can be usefully made.

The fluxgate sensor is a highly-sensitive magnetic sensor which measures magnetic intensity from a saturation timing by using the fact that the saturation timing of a core flux changes in accordance with the external magnetic field when a periodic current flows through a soft magnetic core. Note that as for the fluxgate sensor, many applications have been filed and detailed descriptions are in, for example, International Publication WO2011/155527 and Japanese Unexamined Patent Application Publication No. 2012-154786.

The TMR (Tunneling Magneto Resistive) sensor is a highly-sensitive sensor with a structure in which an insulator layer having a film thickness on the order of 1 nm is interposed between ferromagnetic layers. The TMR sensor achieves high sensitivity by using the tunneling magneto resistive (TMR) effect, in which the electric resistance of the insulator layer significantly changes in accordance with the external magnetic field when a voltage applied vertically with respect to the film surface produces a tunnel effect that permits a current flow through the insulator layer. Note that as for the TMR sensor, many applications have been filed and detailed descriptions are in, for example, International Publication WO2009/078296 and Japanese Unexamined Patent Application Publication No. 2013-242299.

In the magnetic marker detection system of one suitable aspect of the present invention, the magnetic flux density Gh at the position at the height of 250 mm with reference to the surface of the magnetic marker is equal to or larger than 0.5 µT. For example, if the MI element is used, a small-sized magnetic sensor with a magnetic flux resolution of, for example, 0.01 µT to 0.02 µT, can be achieved at low cost. The magnetic sensor with such a magnetic flux resolution at this level can reliably detect magnetism with a magnetic flux density equal to or larger than 0.5 µT. Note that while a magnetic sensor with higher sensitivity can detect magnetism even with a magnetic flux density smaller than 0.5 µT, the cost of the magnetic sensor and peripherals may be increased in order to increase sensitivity. For example, when the magnetic sensor using the MI element is adopted, its sufficient magnetic flux density Gh is on the order of 5 µT. In order to achieve the magnetic flux density Gh exceeding 5 µT, the magnetic flux density Gs of the surface of the magnetic marker may have to be unnecessarily increased accordingly.

Embodiment

Described is an example regarding a magnetic marker detection system 1S for vehicles with combination of a magnetic marker 1 laid on a road surface of a road for vehicles and a magnetic sensor 2 attached to a bottom surface side of a vehicle. Details of the present example are described with reference to FIG. 1 to FIG. 6.

In the magnetic marker detection system 1S for vehicles exemplarily depicted in FIG. 1, a magnetic marker 1 is laid on a road surface 53 so as to be along the center of a lane where a vehicle 5 travels. On a vehicle 5 side, a magnetic sensor 2 is attached to a vehicle's body floor 50, which correspond to a bottom surface of the vehicle 5. An attachment height of the magnetic sensor 2 is varied depending on the vehicle type, but in a range of 100 mm to 250 mm. An output signal from the magnetic sensor 2 is inputted to an ECU, not depicted, or the like of the vehicle 5 for use in various types of control such as automatic steering control and lane departure warning to keep the lane.

The magnetic marker 1 exemplarily depicted in FIG. 2 has a flat circular shape having a diameter of 100 mm and a thickness of 1.5 mm, and can be adhesively jointed onto the road surface 53. The magnetic marker 1 is formed by covering both surfaces of a flat magnetic sheet 11 having a diameter of 100 mm and a thickness of 1 mm with a resin mold 12. The magnetic sheet 11 is acquired by molding an isotropic ferrite rubber magnet having a maximum energy product (BHmax)=6.4 kJ/m$^3$ into a sheet shape. A resin mold 12 has a thickness of 0.3 mm on an upper surface side, which corresponds to a front surface of the magnetic marker 1, and a thickness of 0.2 mm on a lower surface side, which corresponds to a surface of the magnetic marker 1 to be laid down. Laying to the road surface 53 is performed by, for example, adhesive fixing with an adhesive agent. The resin mold is preferably applied also to an outer peripheral side surface of the magnetic marker 1. In this case, the diameter of the magnetic marker 1 is increased from 100 mm by approximately 0.5 mm.

The specification of the magnetic marker 1 in the present example is partially depicted in Table 1.

TABLE 1

| Magnet type | Ferrite rubber magnet |
| Outer diameter | φ 100 mm |
| Thickness | 1.0 mm (except resin mold) |
| Magnetic flux density Gs of the surface | 1 mT |

The magnetic flux density Gs of the surface of this magnetic marker 1 is 1 mT. For example, magnetic sheets for use as attached to a whiteboard at office, the door of a home refrigerator, or the like and magnetic sheets to be attached to a vehicle body such as stickers for newly-licensed drivers have a surface with a magnetic flux density on the order of 20 mT to 40 mT. Compared with these magnetic sheets, it can be intuitively grasped that the magnetic force generated from the magnetic marker 1 of the present example is subtle to the extent that the magnetic marker cannot function as a general magnet which attracts a metallic substance. The magnetic field distribution of this magnetic marker 1 in a vertical direction will be described further below with reference to FIG. 4.

As depicted in a block diagram exemplarily depicted in FIG. 3, the magnetic sensor 2 is a one-chip MI sensor, with a MI element 21 and a drive circuit integrated together. The MI element 21 includes an amorphous wire (an example of a magneto-sensitive body) 211 with approximately zero magnetostriction and made of a CoFeSiB-based alloy, and a pickup coil 213 wound around this amorphous wire 211. The magnetic sensor 2 measures a voltage occurring at the pickup coil 213 when a pulse current is applied to the amorphous wire 211, thereby detecting magnetism acting on the amorphous wire 211 as a magneto-sensitive body.

The drive circuit is an electronic circuit including a pulse circuit 23 which supplies a pulse current to the amorphous wire 211 and a signal processing circuit 25 which samples and outputs a voltage occurring at the pickup coil 213 at a predetermined timing. The pulse circuit 23 includes a pulse generator 231 which generates a pulse signal serving as a source of a pulse current. The signal processing circuit 25 extracts an induced voltage of the pickup coil 213 via a synchronous detector 251 which is opened and closed in conjunction with the pulse signal and amplifies the voltage at a predetermined amplification factor by an amplifier 253. A signal acquired by amplification by this signal processing circuit 25 is outputted to the outside as a sensor signal.

The specification of the magnetic sensor 2 is partially depicted in Table 2.

TABLE 2

| Measurement range | ±0.6 mT |
| Magnetic flux resolution | 0.02 µT |
| Sampling period | 3 kHz |

This magnetic sensor 2 is a highly-sensitive sensor having a measurement range of the magnetic flux density of ±0.6 mT and a magnetic flux resolution in that measurement range of 0.02 µT. This high sensitivity is achieved by the MI element 21 using the MI effect, in which the impedance of the amorphous wire 211 sensitively changes in accordance with the external magnetic field. Furthermore, this magnetic sensor 2 can perform high-speed sampling with a period of 3 kHz, and also supports vehicle's high-speed traveling. In place of sampling with the period of 3 kHz, for example, a magnetic measurement may be performed every time the vehicle moves over a predetermined distance such as 20 mm.

Next, the magnetic field distribution of the magnetic marker 1 of the present example in the vertical direction is described with reference to FIG. 4. FIG. 4 is a semilogarithmic graph depicting simulation results by axisymmetric three-dimensional magneto-static analysis using the finite element method. In FIG. 4, a logarithmic scale of the magnetic flux density of magnetism acting in the vertical direction is set on the vertical axis, and the height in the vertical direction with reference to the surface of the magnetic marker 1 (height from the surface of the marker) is set on the horizontal axis. In FIG. 4, the magnetic flux density when the height from the surface of the marker=0 mm is the "magnetic flux density Gs of the surface", and the magnetic flux density when the height from the surface of the marker=250 mm is the "magnetic flux density Gh at a position at a height of 250 mm (the magnetic flux density Gh at a height of 250 mm as appropriate)".

As depicted in FIG. 4, the magnetic marker 1 can act magnetism having a magnetic flux density equal to or larger than 8 µT in a range of 100 mm to 250 mm assumed as an attachment height of the magnetic sensor 2 (sensor attachment height). When magnetism having a magnetic flux density of 8 µT acts, the magnetic marker 1 can be reliably detected by using the magnetic sensor 2 having a magnetic flux resolution of 0.02 µT (refer to Table 2).

In the magnetic marker 1 of the present example, the magnetic flux density Gs of the surface is as low as 1 mT ($10 \times 10^{-4}$ T) while magnetic characteristics detectable by the magnet sensor 2 are ensured. This magnetic flux density of 1 mT is smaller than one tenth of the magnetic flux density on the order of 20 mT to 40 mT of the surfaces of magnetic sheets to be attached to a whiteboard, the door of a refrigerator, or the like. The magnetic marker 1 has a very subtle magnetic force even compared with these magnetic sheets for office or home use. Thus, if this magnetic marker 1 is laid on the road surface 53, a fear of pulling and attracting a metallic substance such as a nail or bolt is very low.

As described above, the magnetic marker 1 of the present example is a road marker with excellent characteristics having a reduced magnetic force. In the magnetic marker detection system 1S including this magnetic marker 1, the magnetic sensor 2 using the MI element 21 is adopted to allow detection of subtle magnetism acting from the magnetic marker 1.

Next, the reason why the diameter of 100 mm is selected for the magnetic marker 1 is described with reference to computer simulation results of FIG. 5 and FIG. 6.

A graph in FIG. 5 depicts changes in the magnetic flux density Gh at the height of 250 mm when a columnar magnet having a diameter of 20 mm and a height of 50 mm is taken as a reference, the volume is set as constant (volume=15.7 cm$^3$), but the diameter and the height are changed. FIG. 5 is a graph with the diameter of the magnet taken as the horizontal axis and the magnetic flux density Gh at the height of 250 mm taken as the vertical axis. In FIG. 5, the simulation results are depicted by plotting circles, which are accompanied with heights (mm) of the magnet. The simulation in FIG. 5 is a reference simulation of a neodymium magnet having a remanence (residual magnetic flux density) of 1.19 T. It has been confirmed through a computer simulation, demonstrative experiment, and so forth that an isotropic rubber magnet configuring the magnetic marker 1 of the present example has a similar qualitative tendency.

In the graph of FIG. 5, a plot at the left end represents data of a magnet having a diameter of 20 mm×a height of 50 mm serving as a reference. With reference to this plot at the left end, it can be found that the magnetic flux density Gh is improved as the diameter is increased in a diameter range of 20 mm to 60 mm. The magnetic flux density Gh becomes close to a maximum value in a diameter range of 60 mm to 80 mm, and is decreased as the diameter is increased in a diameter range exceeding 80 mm. However, in a diameter range of 80 mm to 100 mm, a rate of variability of the magnetic flux density Gh with respect to the diameter is small, and the decrease of the magnetic flux density Gh is subtle.

To ensure the magnetic flux density Gh required at the position at the height of 250 mm, in view of material cost, that is, the amount of use of a magnetic material required to mold a magnet, the most favorable material cost efficiency can be achieved with a magnet having a diameter of 60 mm to 80 mm. On the other hand, in a diameter range smaller than 60 mm and exceeding 80 mm, the material cost efficiency tends to slightly decrease. However, the possibility of keeping sufficiently high material cost efficiency is high in a diameter range of 80 mm to 100 mm with a low degree of decrease of the magnetic flux density Gh.

A graph in FIG. 6 depicts a simulation of a magnetic field distribution in the vertical direction for magnetic markers of various sizes having the magnetic flux density Gs of the surface of 1 mT. FIG. 6 depicts the results of the computer simulation for magnetic markers each formed of a isotropic rubber magnet having a maximum energy product (BHmax)= 6.4 kJ/m$^3$, as with the magnetic marker 1 of the present example.

This simulation is targeted for magnetic markers having diameters of five types from 20 mm to 150 mm including 100 mm. In this simulation, the thickness is changed so that the magnetic flux density Gs of the surface is 1 mT irrespectively of the difference in diameter. For example, φ100 T 1 in legends represents a magnetic marker having a diameter of 100 mm and a thickness of 1 mm. Note herein that the thickness of the resin mold is ignored and the size of the magnetic marker=the size of the magnet.

The graph in FIG. 6 is a semilogarithmic graph with graph axes similar to those of FIG. 4. According to FIG. 6, it can be found that the magnetic marker having a larger diameter has a higher magnetic flux density Gh at the height of 250 mm with respect to the magnetic flux density Gs of the surface and attenuation of the magnetic flux density in the vertical direction is reduced. For example, by way of comparison as to the magnetic flux density Gh at the height of 250 mm, the magnetic flux density Gh of a magnet having a diameter of 50 mm and a thickness 0.5 mm is 2 µT, while the magnetic flux density Gh of a magnet having a diameter of 100 mm and a thickness of 1 mm is 8 µT. In this manner, as the diameter of the magnetic marker is increased, the magnetism reach ratio (Gh/Gs) tends to increase, which is a ratio of the magnetic flux density Gh at the height of 250 mm with respect to the magnetic flux density Gs of the surface.

When the magnetic flux density Gh required for detection by the magnetic sensor 2 is defined, as the above-described magnetism reach ratio (Gh/Gs) is higher, the magnetic flux density Gs of the surface of the magnetic marker can be more reduced. As the magnetic flux density Gs of the surface is decreased, an effect is produced in which the range of selection of a magnetic material, diameter, thickness, shape, and so forth is widened to improve design flexibility of the magnetic marker.

Thus, in the present example, the diameter of the magnetic marker 1 is set at 100 mm largely on the basis of the following findings based on simulation results depicted in FIG. 5 and FIG. 6.

(1) The most favorable material cost efficiency can be achieved in the diameter range of 60 mm to 80 mm, and sufficiently high material cost efficiency can be kept in the diameter range of 80 mm to 100 mm.

(2) The magnetism reach ratio (Gh/Gs), which is a ratio of the magnetic flux density Gh at the height of 250 mm with respect to the magnetic flux density Gs of the surface, is improved as the diameter of the magnet (magnetic marker) is increased.

The diameter of the magnetic marker may be equal to or larger than 80 mm. With the diameter of 80 mm, even if the magnetic flux density Gs of the surface is reduced to 1 mT, the magnetic flux density Gh at the position at the height of 250 mm is 5 µT. The magnetic flux density of 5 µT can be sufficiently detected by the magnetic sensor 2 having a magnetic flux resolution of 0.02 µT (refer to FIG. 2). While the magnetic marker may have a diameter smaller than 80 mm, the sensitivity of the magnetic sensor may be required to be increased so as to support a smaller magnetic flux density, inviting an increase in cost.

On the other hand, if the diameter of the magnetic marker 1 is too large, it is difficult to distinguish the magnetic marker 1 from a magnetic source such as an iron-made lid of a manhole, for example. The size of the magnetic marker is selectively set preferably in consideration of the type, size, magnetic field intensity, and so forth of a magnetism generation source present on the road where the magnetic marker is to be laid.

In place of the circular shape in the present example, the magnetic marker may have a polygonal shape such as a triangular, quadrangular, or hexagonal shape, may have a rectangular shape, or may have a cross shape with two rectangles crossing.

Methods for laying on the road surface may include a method of adhesive joint by using an adhesive agent or the like and a method of fixing by using a fixing pin in a nail-like shape. Furthermore, a method may be adopted in which a magnetic material before magnetization is laminated or applied in advance to a front surface side of a road surface and a predetermined range is magnetized, thereby forming a magnetic marker equivalent to that of the present example. Another exemplary method may be adopted in which a line applied with a coating containing a magnetic material is printed along the center of a lane and then a predetermined position on the line is magnetized.

When a magnetic sensor using a highly-directive MI element is adopted, one MI element is preferably provided for each direction of magnetism detection. If only magnetic components in the vertical direction are detected, one MI element is enough. However, it is preferable to provide MI elements so as to respectively correspond to three-dimensional directions. If one MI element is provided for each of the three-dimensional directions, magnetic components generated from the magnetic marker can be three-dimensionally detected. It is also preferable, for example, to provide a MI element for detecting magnetism in the vertical direction of the road surface, a MI element for detecting magnetism in a vehicle's traveling direction, and a MI element for detecting magnetism in a lateral direction (vehicle width direction) of the vehicle. When magnetism in the vehicle's traveling direction is detected, for example, with a detection of an inversion of positive and negative poles in a magnetic direction, the position of the magnetic marker in the vehicle's traveling direction can be accurately measured.

If a plurality of MI elements are provided, a pulse circuit and a signal processing circuit may not be individually provided for each MI element, but may be shared for use in a time-division manner. If these circuits can be shared for use, a reduction in size and cost of the magnetic sensor can be easily achieved.

A plurality of magnetic sensors may be disposed along the lateral direction of the vehicle. With a detection of a peak in a magnetic distribution detected by each magnetic sensor, a relative position of each magnetic marker in the lateral direction may be determined.

While the MI sensor using an MI element has been exemplarily described as a magnetic sensor, a fluxgate sensor or TMR sensor can be adopted in place of the above-described MI sensor. If two or more magnetic sensors are used, two or more types among the MI sensor, the fluxgate sensor, and the TMR sensor can be adopted in combination.

The type of the magnetic material or magnet of the magnetic sheet configuring the magnetic marker is not limited to that of the present example. Any of various materials and types can be adopted as the type of the magnetic material or magnet. Any appropriate magnetic material and type is selectively determined in accordance with the magnetic specification, environmental specification, and so forth required for the magnetic marker.

In the present example, the specification of the magnetic marker is selectively determined by using the computer simulation results. For use of a computer simulation, simulation accuracy is confirmed in advance through a demonstrative experiment under part of simulation conditions. Also, as for the magnetic marker 1, it has been confirmed through a demonstrative experiment that magnetic characteristics close to the computer simulation results can be achieved.

While the specific examples of the present invention have been described above in detail as in the above embodiment, these specific examples merely describe examples of technologies included in the claims. Needless to say, the claims should not be restrictively construed by the structures, numerical values, and so forth of the specific examples. The claims include technologies obtained by variously modifying, changing, and combining the specific examples as appropriate by using known technologies, knowledge, and so forth by people skilled in the art.

DESCRIPTION OF SYMBOLS 1 magnetic marker
1S magnetic marker detection system
11 flat magnetic sheet
12 resin mold
2 magnetic sensor
21 MI element
211 amorphous wire (magneto-sensitive body)
213 pickup coil
5 vehicle
50 vehicle's body floor (bottom surface)
53 road surface

What is claimed is:
1. A magnetic marker, wherein
the magnetic marker is configured to be detectable by a magnetic sensor attached to a bottom surface side of a vehicle to achieve driving support control on a vehicle side for supporting driving of a driver when the magnetic marker is laid on a road surface, the magnetic marker has a diameter equal to or larger than 80 mm, is individually laid, and has a magnet, a magnetic flux density Gs on a surface of the magnet is equal to or smaller than 40 mT. (400 G), and a magnetic flux density Gh at a position at a height of 250 mm with reference to the surface of the magnet is equal to or larger than 0.5 µT. (5 mG).

2. The magnetic marker according to claim 1, wherein the magnetic marker has a circular shape.

3. The magnetic marker according to claim 2, wherein the magnetic marker has a flat shape having a thickness equal to or smaller than 5 mm and can be laid on the road surface without boring a recessed accommodation hole.

4. A magnetic marker detection system in which magnetism generated from a magnetic marker laid on a road surface is detected by a magnetic sensor attached to a bottom surface side of a vehicle to achieve driving support control on a vehicle side, wherein the magnetic marker is the magnetic marker according to claim 3.

5. A magnetic marker detection system in which magnetism generated from a magnetic marker laid on a road surface is detected by a magnetic sensor attached to a bottom surface side of a vehicle to achieve driving support control on a vehicle side, wherein the magnetic marker is the magnetic marker according to claim 2.

6. The magnetic marker according to claim 2, wherein the diameter of the magnetic marker is equal to or larger than 80 mm and equal to or smaller than 100 mm.

7. The magnetic marker according to claim 1, wherein a coating or resin mold having a waterproof and wear-resistant effect is applied to a surface of the magnetic marker.

8. A magnetic marker detection system in which magnetism generated from a magnetic marker laid on a road surface is detected by a magnetic sensor attached to a bottom surface side of a vehicle to achieve driving support control on a vehicle side, wherein the magnetic marker is the magnetic marker according to claim 7.

9. The magnetic marker according to claim 1, wherein the magnetic marker has a flat shape having a thickness equal to or smaller than 5 mm and can be laid on the road surface without boring a recessed accommodation hole.

10. A magnetic marker detection system in which magnetism generated from a magnetic marker laid on a road surface is detected by a magnetic sensor attached to a bottom surface side of a vehicle to achieve driving support control on a vehicle side, wherein the magnetic marker is the magnetic marker according to claim 9.

11. A magnetic marker detection system in which magnetism generated from a magnetic marker laid on a road surface is detected by a magnetic sensor attached to a bottom surface side of a vehicle to achieve driving support control on a vehicle side, wherein the magnetic marker is the magnetic marker according to claim 1.

12. The magnetic marker detection system according to claim 11, wherein the magnetic sensor is at least one type among a magneto-impedance sensor, a fluxgate sensor, and a Tunneling Magneto Resistive sensor.

13. The magnetic marker according to claim 1, wherein the diameter of the magnetic marker is equal to or larger than 80 mm and equal to or smaller than 100 mm.

* * * * *